US005568069A

United States Patent [19]
Chow

[11] Patent Number: 5,568,069
[45] Date of Patent: Oct. 22, 1996

[54] HIGH SPEED, LOW POWER PIPELINED LOGIC CIRCUIT

[75] Inventor: Lap-Wai Chow, South Pasadena, Calif.

[73] Assignee: Hughes Aircraft Company, Los Angeles, Calif.

[21] Appl. No.: 395,409

[22] Filed: Feb. 27, 1995

[51] Int. Cl.$^6$ .................... H03K 19/0948; H03K 19/096
[52] U.S. Cl. .......................... 326/113; 326/98; 326/121; 326/17
[58] Field of Search ............................... 326/113, 95, 98, 326/112, 119, 121, 17, 21, 28

[56] References Cited

U.S. PATENT DOCUMENTS

| | | | |
|---|---|---|---|
| 4,541,067 | 9/1985 | Whitaker | 326/113 |
| 4,620,117 | 10/1986 | Fang | 326/113 |
| 4,801,819 | 1/1989 | Theus et al. | 326/28 |
| 5,023,480 | 6/1991 | Gieseke et al. | 326/98 |
| 5,384,493 | 1/1995 | Furuki | 326/95 |

OTHER PUBLICATIONS

Burford et al., "An 180 MHz 16 bit Multiplier Using Asynchronous Logic Design Techniques", *IEEE 1994 Custom Integrated Circuits Conf.*, pp. 10.4–10.4.4.
Ji–Ren et al., "A True Single–Phase–Clock Dynamic CMOS Circuit Technique", *IEEE Journal of Solid–State Circuits*, vol. SC–22, No. 5, Oct. 1987, pp. 899–900.
Lu and Samueli, "200–MHz CMOS Pipelined Multiplier–Accumulator Using a Quasi–Domino Dynamic Full–Adder Cell Design", *IEEE Journal of Solid–State Circuits*, vol. 28, No. 2, Feb. 1993, pp. 123–132.

Song and DeMicheli, "Circuit and Architecture Trade–Offs for High–Speed Multiplication", *IEEE Journal of Solid–State Circuits*, vol. 26, No. 9, Sep. 1991, pp. 1184–1198.

Ji–Ren, Yuan and Svensson, "High–Speed CMOS Circuit Technique", *IEEE Journal of Solid–State Circuits*, vol. 24, No. 1, Feb. 1989, pp. 62–70.

*Primary Examiner*—Edward P. Westin
*Assistant Examiner*—Jon Santamauro
*Attorney, Agent, or Firm*—V. D. Duraiswamy; W. K. Denson-Low

[57] ABSTRACT

A complementary pipelined logic circuit includes (a) a logic unit that processes a plurality of complementary inputs into a pair of complementary outputs, (b) a load circuit that is connected to a voltage supply node to establish complementary outputs having a voltage swing greater than the output voltage swing of the logic unit, and (c) a control circuit that interfaces between the logic unit and the load circuit and responds to a clock input by controlling the logic state of the load circuit's outputs in accordance with the logic state of the logic unit's outputs. The load circuit is preferably implemented as a regenerative latching circuit that pulls the output voltage swing up to the full supply voltage value. The logic unit and control circuit are preferably implemented with N-channel devices for high speed and compactness, while the latching load circuit is preferably implemented with P-channel devices to obtain a full scale voltage pullup.

9 Claims, 2 Drawing Sheets

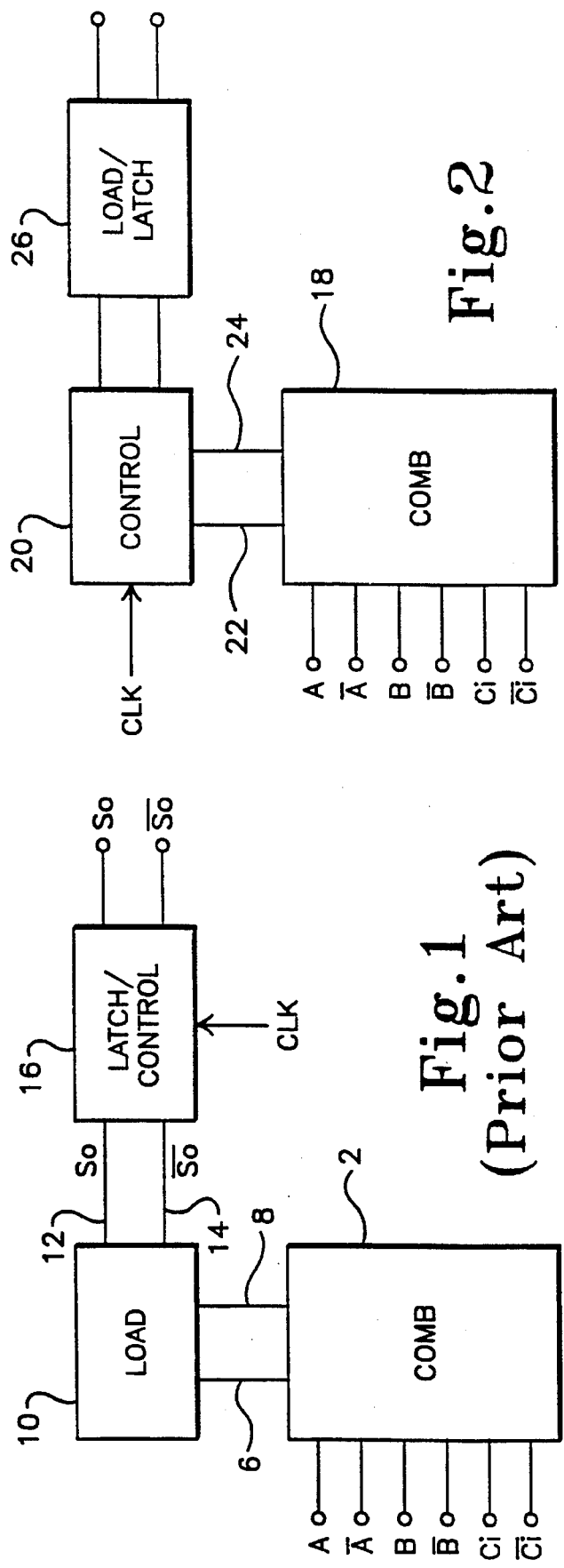
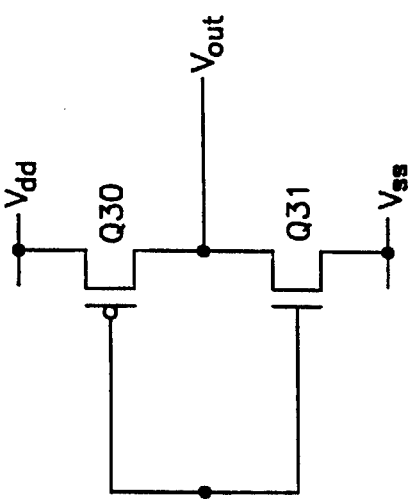
Fig. 2
Fig. 1 (Prior Art)
Fig. 4 (Prior Art)

HIGH SPEED, LOW POWER PIPELINED LOGIC CIRCUIT

BACKGROUND OF THE INVENTION

1. Field of the Invention

This invention relates to logic circuitry, and more particularly to complementary logic circuits for use in pipelined systems.

2. Description of the Related Art

Numerous complementary-logic circuits have been developed which process multiple pairs of complementary inputs to produce a complementary output. Such circuits combine their inputs in various fashions to produce desired logic functions, such as AND, NOR, etc., and are therefore referred to as combinatorial circuits. Multiple combinatorial circuits are typically connected together in pipelined signal processing paths, in which the output of a given circuit is latched and the latched value provided as an input to another circuit.

Individual combinatorial logic circuits are typically implemented in the general format illustrated in FIG. 1, in which a combinatorial logic circuit 2 receives multiple pairs of complementary inputs 4 and produces complementary outputs on output lines 6 and 8. A load circuit 10 receives the complementary outputs of the combinatorial circuit and modifies them to produce complementary logic outputs on lines 12 and 14, which are illustrated as outputs So and $\overline{So}$ for the example of a summing circuit. The logic outputs are latched by a latch/control circuit 16, which operates under the control of a clock signal CLK to alternately latch the logic output on lines 12 and 14 for one portion of the clock period, and to track the logic outputs or otherwise release the latch during the remainder of the clock period. The latched complementary logic outputs from the latch/control circuit 16 can be provided as inputs to another combinatorial circuit in the network.

This general approach has been used for both complementary and non-complementary logic circuits. Applications that involve complementary logic are illustrated by Burford et al., "In 180 MHz 16 bit Multiplier Using Asynchronous Logic Design Techniques", *IEEE 1994 Custom Integrated Circuits Conf.*, pages 10.4.1–10.4.4, and Ji-Ren et al., "A True Single-Phase-Clock Dynamic CMOS Circuit Technique", *IEEE Journal of Solid-State Circuits*, Vol. SC-22, No. 5, October 1987, pages 899–900. These circuits provide a full output voltage swing up to the supply voltage level, but are undesirably slow, use relatively large amounts of power, and have numerous circuit elements that occupy an undesirably large area.

A non-complementary pipelined full-adder circuit of half clock cycle latency that also uses this type of circuit organization is disclosed in Lu and Samueli, "200-MHz CMOS Pipelined Multiplier-Accumulator Using a Quasi-Domino Dynamic Full-Adder Cell Design", *IEEE Journal of Solid-State Circuits*, Vol. 28, No. 2, February 1993, pages 123–132. A pipelined full-adder is a basic building block of a high speed multiplier. Four types of full-adder circuits are described, of which a quasi N-P domino logic circuit was the fastest, with a maximum clock rate capability of 200 MHz. However, this type of logic circuit has a number of drawbacks. It requires complementary clock signals within the same adder, which increases the power consumption and complexity of the clock drivers. It also uses a $C^2MOS$ tri-state output driver, which increases the device size required for the same driving capability and thus increases the capacitive loading of internal nodes and clock signals; the result is lower speed and higher power consumption. The logic evaluation function is performed with P-channel transistors, which increases the input capacitance and thus reduces speed. In addition, the circuits output delay depends upon the input pattern, and can involve the switching of two high capacitive loading nodes that further slows the circuit operation. There is also an undesirable static current during the precharge period that adds to the power consumption.

In Song and DeMicheli, "Circuit and Architecture Trade-Offs for High-Speed Multiplication", *IEEE Journal of Solid-State Circuits*, Vol. 26, No. 9, September 1991, pages 1184–1198, a complementary logic circuit is disclosed that employs a regenerative load circuit to increase its output voltage swing. However, this circuit does not have any latching capability and is not applicable to pipelined systems.

SUMMARY OF THE INVENTION

The present invention seeks to provide a complementary pipelined circuit design that is faster than previous approaches, has a reduced power consumption, requires fewer circuit devices, occupies less area, minimizes static currents, operates with only a single-phase clock input and yet provides a full-scale output voltage swing.

These goals are achieved with a complementary pipelined logic circuit in which a control circuit interfaces between the output of a complementary logic unit and a load circuit, with the load circuit pulling the logic unit's output up to a full voltage swing. The control circuit performs a switching function, in response to a clock signal, that causes the load circuit's full swing logic outputs to follow the logic unit's limited swing complementary outputs.

In the preferred embodiment the load circuit is configured to establish a HI logic output at substantially a full supply voltage level. Inverters are connected to the load circuit outputs, with a HI logic state at one of the load circuit's outputs substantially inhibiting a flow of static current through its associated inverter.

The load circuit is preferably implemented as a regenerative latching circuit that both pulls up the output of the logic unit, and adds a latching capability that makes the circuit useful in pipelined architectures. The logic unit is preferably implemented with an N-channel pass-gate circuit, with the control circuit comprising a pair of N-channel transistors whose source-drain circuits are connected between respective logic outputs of the load circuit and logic unit, and whose gates are connected to a common clock input. A full scale voltage pullup is achieved by implementing the load circuit with a pair of P-channel transistors whose source-drain circuits are connected between a voltage supply node and the load's logic outputs, and whose gates are cross-coupled. The control circuit transistors provide voltage drops that maintain the voltage levels of the load circuit's outputs at predetermined voltage drops above the logic unit's outputs.

These and other features and advantages of the invention will be apparent to those skilled in the art from the following detailed description, taken together with the accompanying drawings.

BRIEF DESCRIPTION OF THE DRAWINGS

FIG. 1 is a block diagram, described above, of a prior pipelined logic circuit architecture;

FIG. 2 is a block diagram of the circuit architecture employed by the invention;

FIG. 4 is a schematic diagram of a preferred inverter circuit for use in the full-adder circuit of FIG. 3.

DETAILED DESCRIPTION OF THE INVENTION

Figure 3:
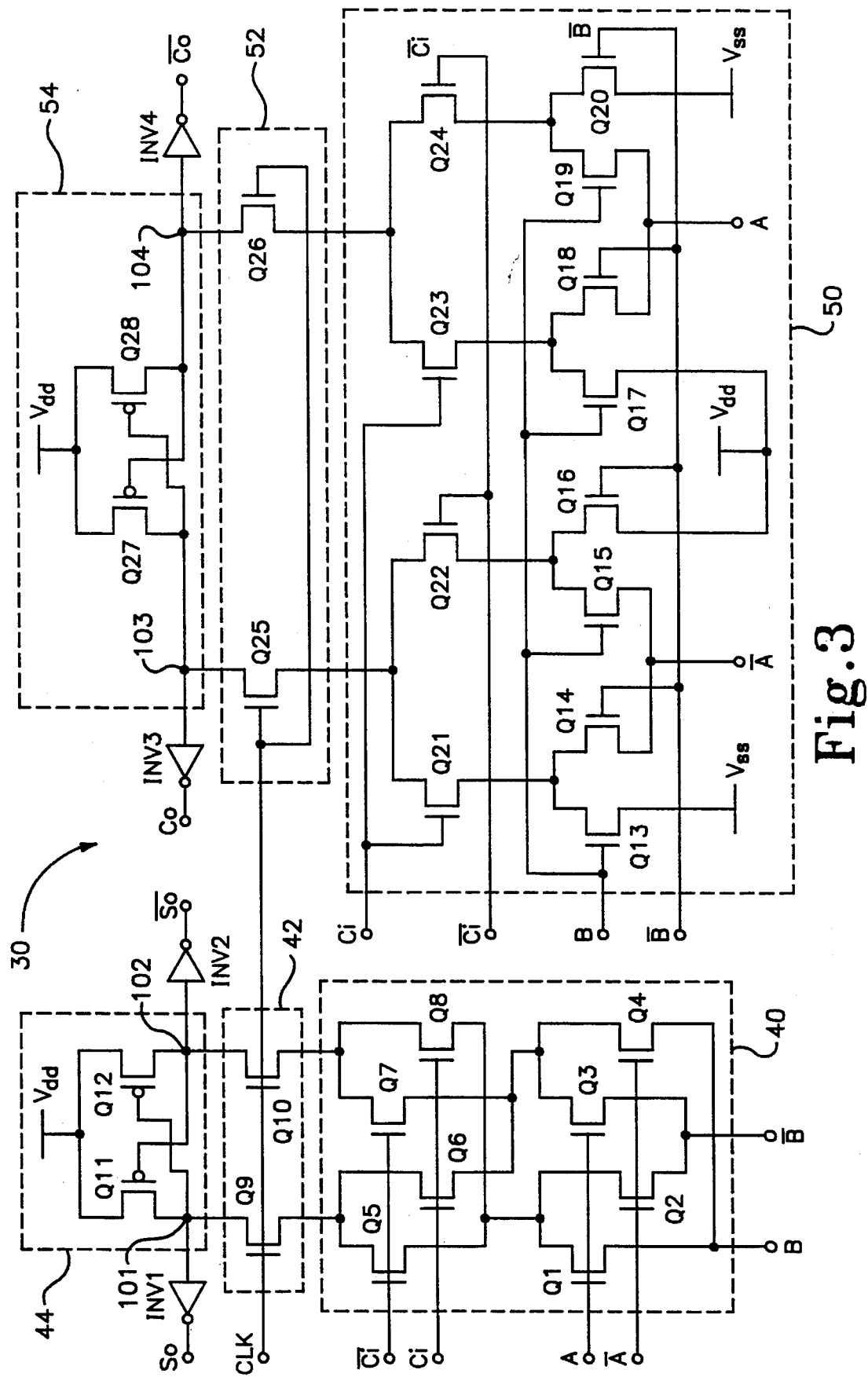
FIG. 3 is a schematic diagram of a pipelined full-adder circuit that employs the principals of the invention.

FIG. 2 illustrates the general approach taken by the invention to providing a full-scale voltage output swing for a complementary combinatorial logic unit 18, while achieving improvements over prior circuit designs in terms of operating speed, power consumption, circuit complexity and circuit area. The combinatorial logic unit 18 is illustrated as having three pairs of complementary inputs A, $\overline{A}$; B, $\overline{B}$; and Ci, $\overline{Ci}$ (Ci is used instead of C to distinguish this input from the carry output of a full-adder circuit, which is conventionally designated Co). Instead of pulling up the output voltage from the logic circuit with a load and then latching the load's output, as in prior approaches, a control circuit 20 is interfaced between the complementary outputs 22, 24 of the logic unit 18 and a pullup load circuit 26 that also preferably incorporates a latching function. The control circuit 20 operates as a switch under the control of a clock signal CLK to alternately connect and disconnect the logic unit outputs 22, 24 with the load/latch circuit 26.

The combinatorial logic unit 18 preferably employs dual N-channel pass-gate circuitry, which has a lower input impedance than P-channel circuits. In CMOS N-well technology, the conductance of the N-channel devices is 2.5–3 times higher than P-channel devices, so that an N-channel device can be 2.5–3 times smaller than a P-channel device for the same driving capability. The use of N-channel devices thus significantly reduces the circuit's input capacitance, with a corresponding increase in operating speed. Furthermore, the complementary outputs of dual N-channel logic can provide HI and LO outputs at the same time, which speeds up the regenerative process of a cross-coupled P-channel load circuit that is described below as a preferred implementation of the load/latch circuit 26.

A major disadvantage of N-channel pass-gate logic is an inability to produce an output voltage swing, between LO and HI, all the way from ground to the positive voltage supply level. This is due to threshold voltage drops in the N-channel devices. The invention compensates for this disadvantage by using cross-coupled P-channel devices in the load/latch circuit 26 to pullup the voltages on the logic unit's outputs 22 and 24 to the full supply voltage level, and by using inverters and output amplifying buffers. Pulling the HI logic signals up to full scale inhibits static currents in the inverters (assuming the voltage threshold drop is greater for N-channel than for P-channel devices) and also increases noise immunity.

The general circuit architecture illustrated in FIG. 2 is applicable to a full range of combinatorial logic functions. Since high speed multipliers are key components in digital signal processing and a pipelined full-adder circuit is a basic building block for this kind of multiplier, a full-adder circuit that uses the principles of the invention will now be described in detail as a specific example of how the invention can be implemented. However, this does not limit the generality of the inventive approach to virtually any other kind of complementary combinatorial logic function.

Referring now to FIG. 3, a full-adder pipelined circuit 30 is shown which includes a sum evaluator 40 and a carry evaluator 50 that collectively function as the dual pass-gate logic evaluator unit 18 of FIG. 2. As the names suggest, sum evaluator 40 computes the sum So of the inputs A, B and Ci and its complement $\overline{So}$, while carry evaluator 50 computes the carry Co and its complement $\overline{Co}$. The full-adder circuit 30 includes control circuits 42 and 52 and full voltage swing pullup load/latch circuits 44, 54.

The sum evaluator 40 and carry evaluator 50 are implemented in a conventional manner, using only N-channel transistors. As mentioned previously, this allows the circuit to perform at a faster speed. The control circuits 42, 52 are also implemented with only N-channel transistors, which allows for the use of a one-phase clock signal (CLK). As a result, the circuit exhibits a reduced clock capacitive loading than if larger P-channel transistors were used, and power consumption due to clock drivers is reduced. This is important, since power consumed by clock drivers in high speed pipelined multipliers is a significant part of the total system power consumption. In addition, only one level of gate stage is used to implement control circuits 42, 52. This further improves the circuit speed, since the delay usually associated with two-gate stage devices is eliminated.

Simulations have shown the full-adder circuit 30 to be capable of operating at a maximum clock rate of over 400 MHz in 1.2 micron minimum feature size CMOS devices (or a 2.5 ns time period), while consuming 20% to 25% less power than the quasi N-P domino full-adder circuit.

Furthermore, since a single-phase clock is used and no precharge period is involved, the clock skew rate and rise/fall time requirements are much more relaxed than with conventional high speed full-adder circuits. For example, a clock skew rate of 0.4 ns (or 16% of the clock period) between consecutive full-adder circuits 30 in a pipelined multiplier may properly be used. Moreover, unlike some conventional full-adder circuits which commonly exhibit output spikes, there are no spikes at the outputs So and Co of full-adder circuit 30.

By themselves, the sum and carry evaluator circuits 40 and 50 are conventional. The sum evaluator 40 includes eight N-channel transistors Q1–Q8. The gates of Q1 and Q3 are tied together and receive input signal A; the gates of Q2 and Q4 are tied together and receive input signal $\overline{A}$; the gates of Q5 and Q7 are tied together and receive input signal $\overline{Ci}$; and the gates of Q6 and Q8 are tied together and receive input signal Ci. The source of Q1 is connected to the source of Q4 and to input signal B, while the drain of Q1 is connected to the drain of Q2 and to the sources of Q5 and Q8. In a complementary manner, the source of Q2 is connected to the source of Q3 and to input signal $\overline{B}$, while the drain of Q3 is connected to the drain of Q4 and to the sources of Q6 and Q7.

The carry evaluator 50 has 12 N-channel transistors Q13–Q24. The gates of transistors Q13, Q15, Q17, Q19 are tied together and receive input signal B; the gates of Q14, Q16, Q18 and Q20 are tied together and receive input signal B; the gates of Q21 and Q23 are tied together and receive input signal Ci; and the gates of Q22 and Q24 are tied together and receive input signal $\overline{Ci}$. The sources of Q13 and Q20 are connected to the low voltage supply node $V_{ss}$ ($V_{ss}$ in this case is at ground potential); the sources of Q14 and Q15 are tied together and receive input signal $\overline{A}$ while the sources of Q16 and Q17 are connected to the high voltage supply node $V_{dd}$ such as 5V; and the sources of Q18 and Q19 are tied together and receive input signal A. The drains of Q13 and Q14 are connected to the source of Q21; the drains of Q15 and Q16 are connected to the source of Q22; the drains of Q17 and Q18 are tied together and connected to the source of Q23; and the drains of Q19 and Q20 are connected to the source of Q24.

The control circuits 42 and 52 include N-channel transistor pairs Q9, Q10 and Q25, Q26, respectively. The gates of transistors Q9, Q10, Q25 and Q26 are connected together to receive the clock signal CLK. The source of Q9 is connected to the drains of Q5 and Q6, while the source of Q10 is connected to the drains of Q7 and Q8 of the sum evaluator 40. The drains of Q9 and Q10 are connected to the complementary outputs of the pullup load/latch circuit 44, designated as nodes 101 and 102. In a similar fashion, the source of Q25 in control circuit 52 is connected to the drains of Q21 and Q22 of the carry evaluator 50, while the source of Q26 is connected to the drains of Q23 and Q24. The drains of control circuit transistors Q25 and Q26 are connected to the complementary output nodes 103 and 104 of the control circuit 52, respectively.

The load/latch circuits 44 and 54 are implemented with P-channel transistor pairs Q11, Q12 and Q27, Q28, respectively. The transistors of each load/latch circuit are cross-coupled, with the gate of Q11 in the sum load/latch circuit 44 connected to node 102 and its drain connected to node 101, and the gate of Q12 connected to node 101 and its drain connected to node 102. The sources of Q11 and Q12 are both connected to $V_{dd}$. Similarly, the gate of Q27 in the carry load/latch circuit 54 is connected to node 104 and its drain is connected to node 103, while the gate of Q28 is connected to node 103 and its drain is connected to node 104; the sources of both Q27 and Q28 are connected to $V_{dd}$. The full voltage swing outputs at nodes 101–104 are inverted by inverters INV1–INV4 to provide the complementary sum and carry outputs So, $\overline{So}$, Co and $\overline{Co}$, respectively. The inverters INV1–INV4 amplify and buffer the output signals.

In the absence of the P-channel load/latch circuits 44 and 54, full $V_{dd}$ voltages representing logical "1" would not be available at nodes 101–104. This is because an N-channel transistor will not pass a full $V_{dd}$ HI voltage to its output due to an inherent threshold voltage drop. For example, if the source of an N-channel transistor is connected to a 5 V $V_{dd}$, when the transistor is turned on by biasing its gate, the voltage available at the drain will be the 5 V $V_{dd}$ less the threshold voltage, or 4 V in the case of a 1 V threshold device.

Using P-channel transistors for load/latch circuits 44 and 54 ensures that either a 5 V logical "1" or a 0 V logical "0" is available at nodes 101–104. For example, if at the beginning of a clock signal CLK there is a logical "1" at node 101 and a logical "0" at node 102, the 0 V logical "0" at node 102 will switch transistor Q11 "closed" and the 5 V $V_{dd}$ voltage will be applied through Q11 to node 101. Hence, the voltage at node 101 is pulled up to a full $V_{dd}$ voltage of 5 V. Q12, on the other hand, will not be turned on, since a voltage of 5 V is now at its gate. Q12 will therefore have an "open" switch state and decouple node 102 from $V_{dd}$. Node 101 will thus have a 5 V logical "1" and node 102 will have a 0 V logical "0". The load circuits thus function as regenerative positive feedback latches, with the "on" transistor of each load pair holding the other transistor "off", and vice versa. The full voltage swing also helps to inhibit a static current that would otherwise flow in inverters INV1–INV4, and thus reduces power consumption.

FIG. 4 shows a conventional preferred CMOS inverter design. The inverter consists of a P-channel transistor Q30 and an N-channel transistor Q31 with their source-drain circuits connected in series between $V_{dd}$ and $V_{ss}$, their gates connected together to receive an input signal $V_{in}$ from the associated load/latch circuit, and a common drain connection providing an inverted output $V_{out}$.

If the voltage at $V_{in}$ is greater than 1 V but less than 4 V, both the P-channel and the N-channel transistors Q30 and Q31 will be partially turned on and conduct a static current. However, the load/latch circuits 44, 54 ensure that the voltage available at the inverter inputs is either a full 5 V logical "1" or a 0 V logical "0". Thus, the P-channel and N-channel transistors will either be totally on or totally off, and a flow of static current in inverters INV1–INV4 is accordingly inhibited.

Load/latch circuits 44, 54 also help shorten the required pulse width of clock signal CLK. That is, clock signal CLK need only remain in a HI logical state until the threshold voltage necessary to turn on transistors Q11, Q12, Q27 and Q28 has been attained. Once this voltage is achieved, the regenerative feedback process of the P-channel transistors ensures the proper voltage is available at the output nodes. Thus, clock signal CLK need remain in a HI state for a shorter period of time.

The clock signal drives only four N-channel devices; no P-channel device is involved and no complementary clock signal is required. This results in a significantly lower clock capacitive loading which is only about one-fourth that of the NP Domino adder circuit. Because of the new full-adder circuit's very high speed, the power consumed by clock drivers can become a significant part of the total power consumption of a pipelined multiplier circuit in which the adders are used. The clock drivers may dissipate about half of the total power, so reducing the clock loading results in an important overall power reduction. Also, since only a single phase clock is required and no precharge period is involved, the clock signal's skew rate and rise/fall time requirements are much more relaxed than with NP Domino adders. The circuit has been simulated to show that, with a 400 MHz clock frequency, a clock skew of 0.4 ns (16% of the clock period) between consecutive adders could still work properly.

The logical operations performed by the full-adder circuit 30 are as follows: So=A+B+Ci and Co=AB+Aci+BCi, where So is the sum and Co is the carry. Table 1 shows the possible combinations of input signals A, B and Ci and the corresponding results of these operations.

TABLE 1

| A | B | C | Sum (So) | Carry (Co) |
|---|---|---|----------|------------|
| 0 | 0 | 0 | 0 | 0 |
| 1 | 0 | 0 | 1 | 0 |
| 0 | 1 | 0 | 1 | 0 |
| 1 | 1 | 0 | 0 | 1 |
| 0 | 0 | 1 | 1 | 0 |
| 1 | 0 | 1 | 0 | 1 |
| 0 | 1 | 1 | 0 | 1 |
| 1 | 1 | 1 | 1 | 1 |

The operation of the full-adder circuit will now be described. If inputs A, B and Ci are logical "0" (i.e., ABCi=000), their complements will be logical "1" (i.e., $\overline{ABCi}$=111), Q1 of sum evaluator 40 will not be turned on, and a voltage of 0 V will remain at its drain. However, Q2 will be turned on since both its gate and source will receive a logical "1" or 5 V stimulus. Thus, a logical "1" will appear at the drain of Q2. Q3 will not be turned on and Q4, having 0V at its source, will not conduct. A logical "0" will thus be produced at the drains of both Q3 and Q4.

Q5 will be turned on by the logical "1" it receives at its gate and, since the source of Q5 is connected to the drain of Q2, Q5 will conduct. Thus, a logical "1" will appear at the drain of Q5. Q6, Q7 and Q8 will either be off or not conducting, with logical "0s" at their drains.

In response to a clock pulse CLK, a logical "1" at the drain of Q5 will be passed on to node 101, whereas node 102 will have a logical "0". Pullup load circuit 44 ensures that a full 5 V logical "1" is at node 101 and a 0 V logical "0" at the node 102, with control transistor Q9 sustaining the voltage differential between Q5 and node 101 by its threshold voltage. After inversion by inverter INV1, the logical "1" at node 101 appears as an output logical "0". Thus, the sum So of 000 is 0, as shown in Table 1 above.

Meanwhile, transistors Q13, Q15, Q17 and Q19 of carry evaluator 50 will not be turned on. Q18 and Q20 will not conduct, since their sources are either connected to $V_{ss}$ or to a logical "0". Q14 will receive a logical "1" at both its gate and its source, and will therefore conduct. Q16 will also conduct, resulting in a logical "1" at the drains of Q14 and Q16.

Q21, Q23 and Q24 will not conduct and a logical "0" will be present at their respective drains. Q22, on the other hand, will conduct and a logical "1" will appear at its drain. In response to a clock pulse CLK, the logical "1" at the drain of Q22 is passed on to node 103 and latched at $V_{dd}$ by the load/latch circuit 54, with the voltage differential between node 103 and Q22 sustained by the threshold voltage of Q25. After inversion by inverter INV3, the logical "1" at node 103 is a logical "0" for the carry output Co.

While particular illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A complementary pipelined logic circuit, comprising:

a voltage supply node, an N-channel pass-gate logic unit having a plurality of pairs of complementary inputs and producing a pair of complementary outputs with a predetermined voltage swing, a load circuit connected to said voltage supply node to establish a pair of complementary logic outputs with a voltage swing greater than the output voltage swing of said logic unit, a control circuit interfacing between said logic unit and said load circuit, said control circuit having a clock input and operating in response to a clock signal applied to said clock input to control the logic states of said load circuit logic outputs in accordance with the logic states of said logic unit outputs, and a pair of inverters connected to respective ones of said load circuit complementary logic outputs, with a HI logic state at one of said logic outputs substantially inhibiting the flow of static current through its associated inverter, said inverters producing outputs suitable for direct application to the inputs of another logic circuit with a pass-gate architecture.

2. The circuit of claim 1, wherein said load circuit is configured to establish a HI logic output at substantially the supply node voltage.

3. The circuit of claim 1, said load circuit comprising a regenerative latching circuit.

4. The circuit of claim 3, said load circuit comprising a pair of P-channel transistors having source-drain circuits connected between said voltage supply node and respective logic outputs, and cross-coupled gates.

5. The circuit of claim 4, said control circuit comprising a pair of N-channel transistors having source-drain circuits connected between respective load circuit logic outputs and respective outputs from said logic unit, and gates connected to said clock input.

6. A complementary pipelined logic circuit, comprising:

a voltage supply node, an N-channel pass-gate complementary logic unit having a plurality of pairs of complementary inputs and producing a pair of complementary outputs at voltage levels less than the voltage of said supply node, a load circuit connected to said voltage supply node and establishing complementary logic outputs at substantially the voltage of said supply node and at a LO voltage level, respectively, a voltage drop switching circuit having a clock input and connected to alternately connect and disconnect, under the control of a clock signal applied to said logic input, the outputs of said logic unit with respective load circuit logic outputs, said switching circuit maintaining the voltage level of the HI logic unit output at a predetermined voltage drop below the voltage of the load circuit logic output to which it is connected, and a pair of inverters connected to respective ones of said complementary logic outputs, with a HI logic state at one of said logic outputs substantially inhibiting the flow of static current through its associated inverter, said inverters producing outputs suitable for direct application to the inputs of another logic circuit with a pass-gate architecture.

7. The circuit of claim 6, said load circuit comprising regenerative latching circuit.

8. The circuit of claim 7, said load circuit comprising a pair of P-channel transistors having source-drain circuits connected between said voltage supply node and respective logic outputs, and cross-coupled gates.

9. The circuit of claim 8, said switching circuit comprising a pair of N-channel transistors having source-drain circuits connected between respective load circuit logic outputs and respective outputs from said logic unit, and gates connected to said clock input.

* * * * *